United States Patent

Mori et al.

[11] Patent Number: 5,191,218
[45] Date of Patent: Mar. 2, 1993

[54] VACUUM CHUCK

[75] Inventors: Tetsuzo Mori, Atsugi; Mitsuji Marumo, Sagamihara; Kazunori Iwamoto, Yokohama; Yuji Chiba, Isehara; Kazuyuki Kasumi, Atsugi, all of Japan

[73] Assignee: Canon Kabushiki Kaisha, Tokyo, Japan

[21] Appl. No.: 723,336

[22] Filed: Jun. 28, 1991

[30] Foreign Application Priority Data

Jun. 29, 1990 [JP] Japan ................................. 2-169938
Jul. 12, 1990 [JP] Japan ................................. 2-182656

[51] Int. Cl.$^5$ .............................................. H01L 21/00
[52] U.S. Cl. ................................. 250/453.11; 279/3; 269/21; 340/611
[58] Field of Search .......................... 250/453.1; 279/3; 269/21; 340/605, 611; 73/40

[56] References Cited

U.S. PATENT DOCUMENTS 4,269,061  5/1981  Hatsuno et al. ................. 340/605

FOREIGN PATENT DOCUMENTS 0357424   3/1990  European Pat. Off. .
2-100311  4/1990  Japan .

Primary Examiner—Jack I. Berman
Attorney, Agent, or Firm—Fitzpatrick, Cella, Harper & Scinto

[57] ABSTRACT

A vacuum-attraction holding device includes a holding base having an attracting surface, for holding a substrate thereon; a suction passageway formed in the base, for supplying a vacuum to the holding base to attract the substrate to the attracting surface; and a pressure sensor provided in the base and being communicated with the suction passageway.

16 Claims, 11 Drawing Sheets

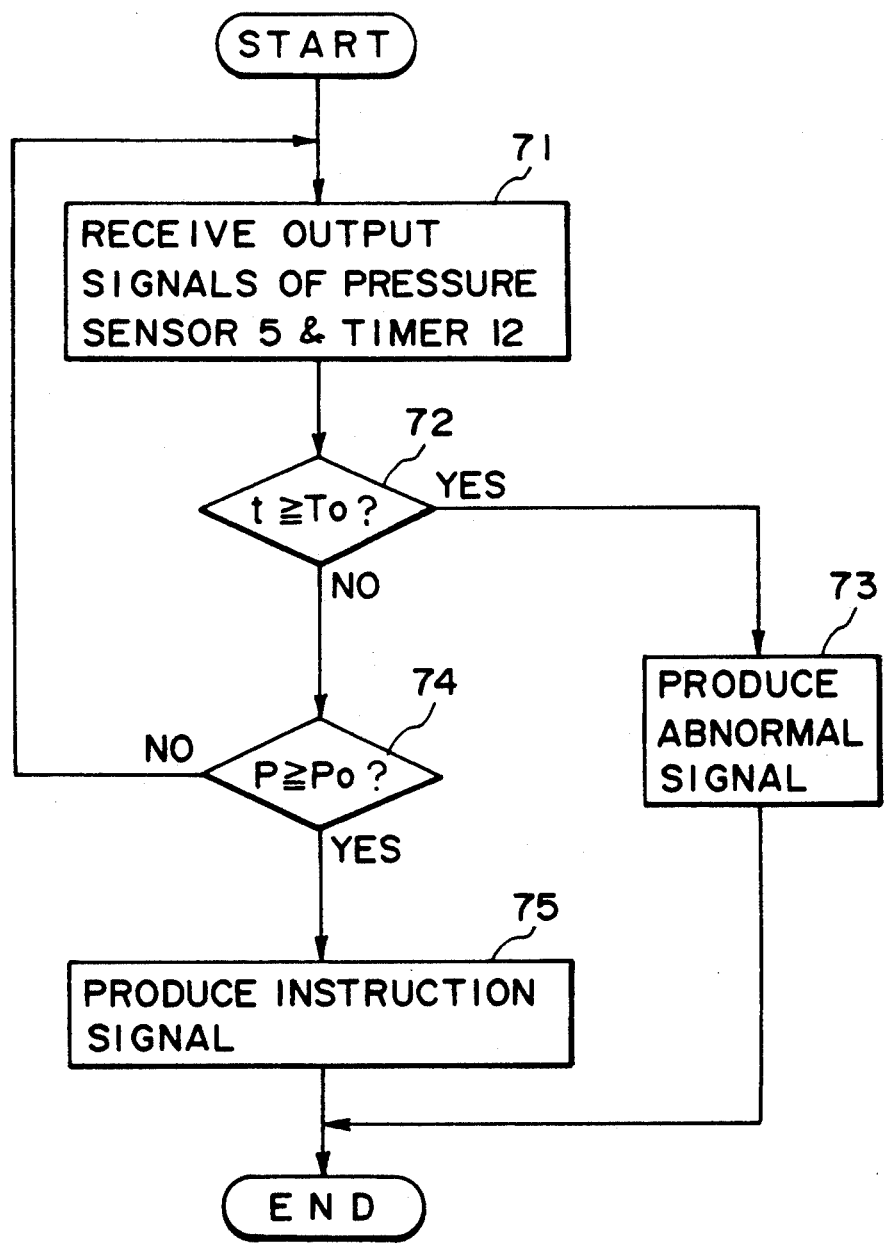
F I G. 4

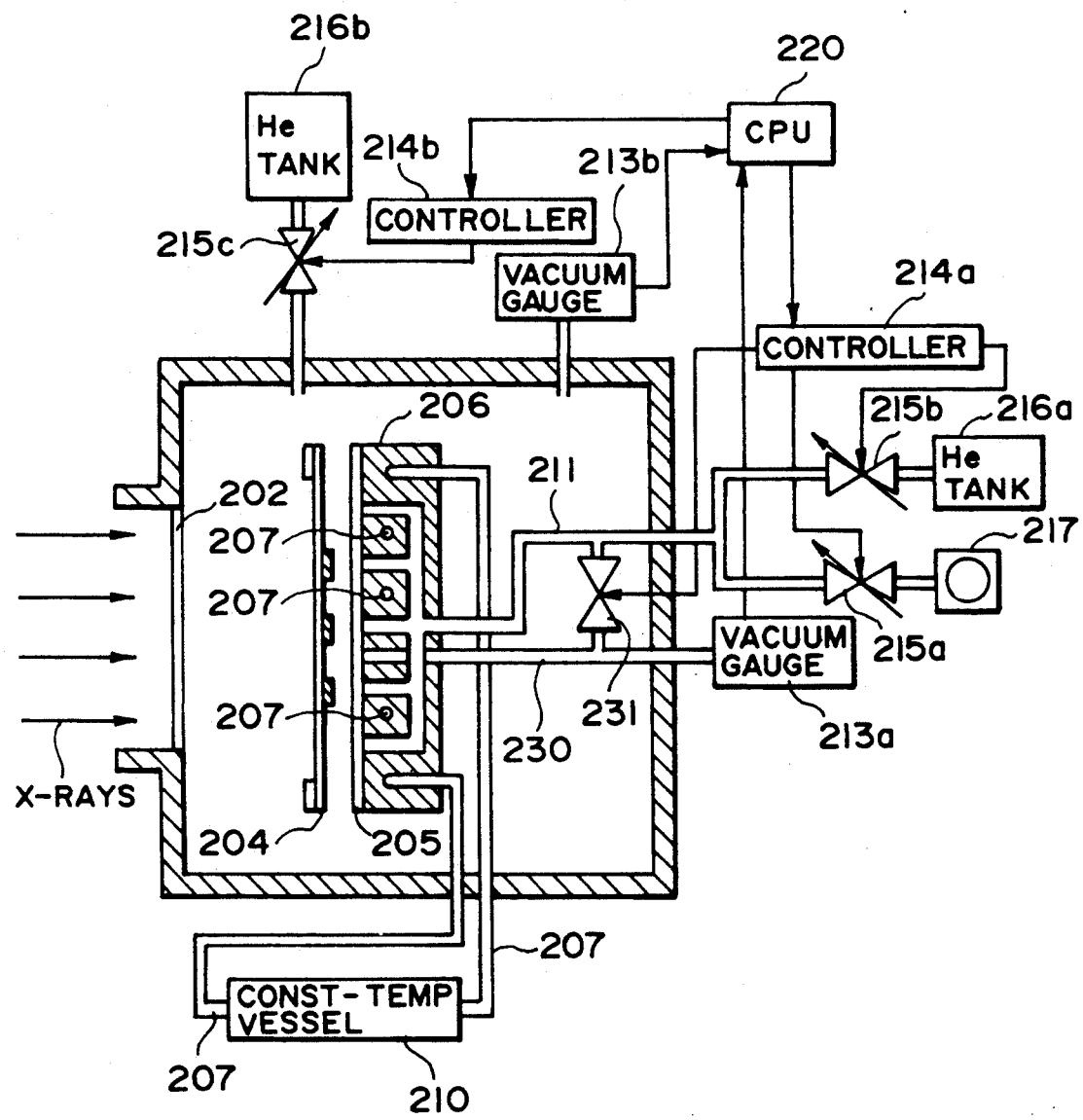
F I G. 9

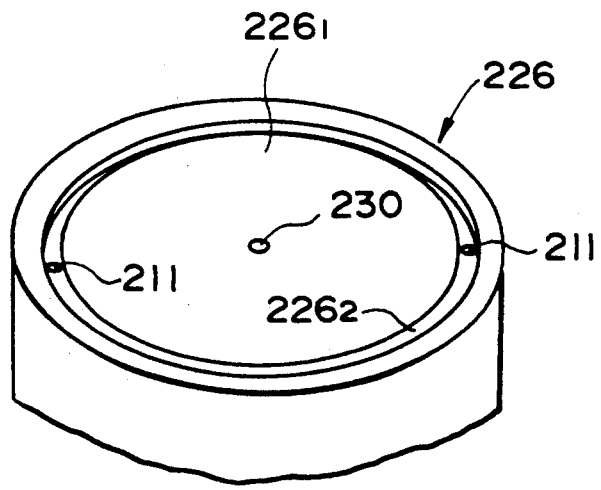
F I G. 11
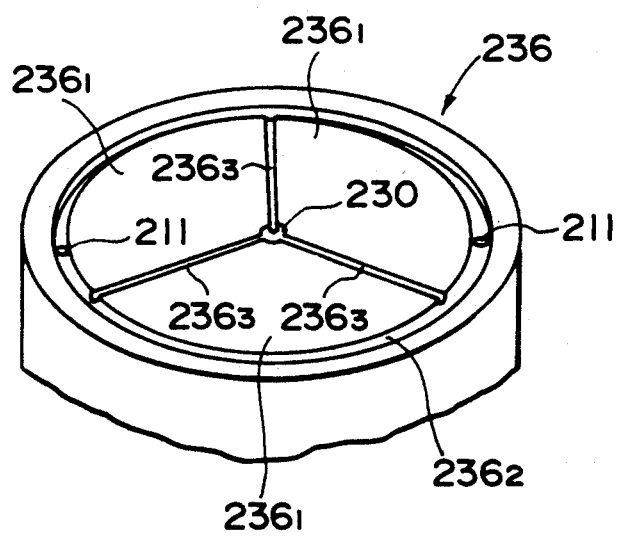
F I G. 12

VACUUM CHUCK

FIELD OF THE INVENTION AND RELATED ART

This invention relates generally to a vacuum attraction type substrate holding device for holding a substrate through vacuum attraction applied to the bottom face of the substrate. More particularly, the invention is concerned with such a vacuum attraction type substrate holding device which is usable in a semiconductor device manufacturing apparatus, for example, as a vacuum chuck. In another aspect, the invention is concerned with an exposure method and apparatus which uses such a vacuum attraction type holding device, for manufacture of semiconductor devices.

In the manufacture of semiconductor devices, a substrate holding device for holding a substrate such as a semiconductor wafer, onto which a pattern for preparation of semiconductor devices is to be lithographically transferred, is used. An example is a vacuum attraction type wafer holding device (vacuum chuck) wherein a wafer is held through vacuum attraction applied to the bottom face thereof (Japanese Laid-Open Patent Application No. 1-14703).

As regards an exposure apparatus usable with such a substrate holding device, there are many types of exposure apparatuses. Examples are: exposure apparatuses using deep UV light as an exposure light source, and X-ray exposure apparatuses which use X-rays contained in synchrotron orbital radiation (Japanese Laid-Open Patent Application No. 2-100311).

For lithographic transfer of an ultra-fine pattern onto a wafer, use of a high-precision wafer holding device is necessary. Further, in some exposure apparatuses such X-ray exposure apparatuses wherein a mask and a wafer are placed opposed to each other with a very small gap (proximity gap) maintained therebetween heat is produced by the application of exposure energy used for the lithographic transfer of a mask pattern. Thus, it is desirable that the wafer holding device used has a structure effective to remove the heat from the wafer efficiently, since, if not so, a possible temperature rise in the wafer or possible thermal deformation of the wafer damages the pattern transfer precision.

SUMMARY OF THE INVENTION

It is accordingly an object of the present invention to provide a substrate holding device of vacuum attraction type by which a substrate can be held with very high precision.

In accordance with an aspect of the present invention, the pressure for holding a substrate can be controlled with very high precision. Thus, when such a holding device is incorporated into a semiconductor device manufacturing exposure apparatus, precise transfer of an ultra-fine pattern onto a substrate, such as a wafer, is assured and, therefore, enhanced yield and productivity are ensured.

It is another object of the present invention to provide a substrate holding device of vacuum attraction type by which the temperature of a substrate held thereon can be controlled during exposure thereof. Additionally, good flatness of the substrate can be retained.

In another aspect of the present invention, a temperature-controlled fluid such as water may be sent through a flow passageway formed in a substrate holding base. Also, the pressure in a clearance between the substrate and the holding base may be controlled precisely to maintain therebetween a small contact heat resistance not greater than a predetermined level.

In a further aspect of the present invention, a pressure sensor may be provided in a substrate holding base of a substrate holding device or, alternatively, an additional passageway may be formed in the holding base separately from a vacuum applying suction passageway and, to this additional passageway, a pressure sensor may be provided. This effectively assures precise measurement of the pressure related to the vacuum attraction of the substrate.

In a vacuum-attraction substrate holding device of the present invention, a pressure sensor may be provided in a holding base to detect the pressure in a closed space or in a suction passageway. This makes it possible to detect the pressure at the bottom of the substrate very precisely, without being affected by the ambience in which the holding device is placed or by the condition of the bottom face of the substrate.

The pressure sensor may detect a differential pressure between the inside pressure of the closed space or of the suction passageway and the outside pressure (atmospheric pressure) introduced through an introduction passageway formed in the holding base. On that occasion, as compared with direct detection of the inside pressure of the closed space or of the suction passageway, it is possible to detect the pressure difference between the top and bottom faces of the substrate even if the outside pressure of the holding device changes.

The holding device may be equipped with a timer for measuring evacuation time. Only when the pressure in the closed space or in the suction passageway detected by the pressure sensor becomes lower than a predetermined level within a predetermined evacuation time period, a control circuit may operate to produce an instruction signal, starting a succeeding process. This is effective to set an optimum level of a difference between the pressures at the top and bottom faces of the substrate. As a result, it is possible to hold the substrate with an optimum attracting force and, therefore, to minimize distortion of the substrate. Further, this is effective to minimize the evacuation time necessary for the vacuum attraction of the substrate and, therefore, it is possible to accomplish the vacuum attraction of the substrate in a shortest time.

A substrate holding device according to a further aspect of the present invention may be provided with a gauging passageway for communicating a vacuum gauge and a chucking surface of a holding base. Almost all the gas in the gauging passageway can be discharged outwardly with the execution of evacuation to some degree. Thus, the level of pressure as measured by the pressure gauge is equal to the pressure in a small clearance defined between the chucking surface of the holding base and the bottom face of the substrate. By controlling appropriate means on the basis of an output signal from the vacuum gauge so that the pressure in the small clearance is held at a predetermined level, it is possible to retain the desired level of pressure in the small clearance precisely.

Valve means controlled through a control means may be interposed between the gauging passageway and an evacuation passageway. The valve means may be so controlled that, after it is opened by the control means, the vacuum attraction starts. This assures quick discharging of the gas in the gauging passageway through the valve means, such that a desired level of pressure can be attained in the small clearance precisely and quickly.

An exposure method and apparatus according to a still further aspect of the present invention may use any one of the substrate holding devices described above, and because of the attainment of high precision for the measurement and/or control of the pressure in the small clearance, high pattern transfer precision can be assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a flow chart of the control operation in the device of FIGS. 2A and 2B.

FIG. 9 is a sectional view of an exposure apparatus having a wafer holding device, according to a further embodiment of the present invention.

FIGS. 11 and 12 are fragmentary perspective views, respectively, showing modified forms of wafer chucking surfaces.

DESCRIPTION OF THE PREFERRED EMBODIMENTS

Before describing details of the present invention, a problem underlying the present invention will first be explained.

Figure 1A:
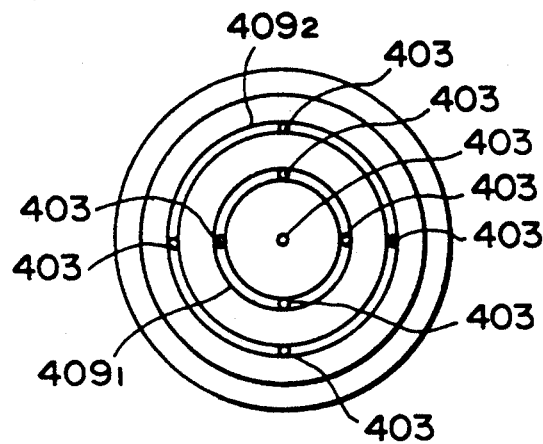
FIGS. 1A and 1B are a top plan view and a sectional view, respectively, of a wafer holding device without the present invention.
Figure 1B:
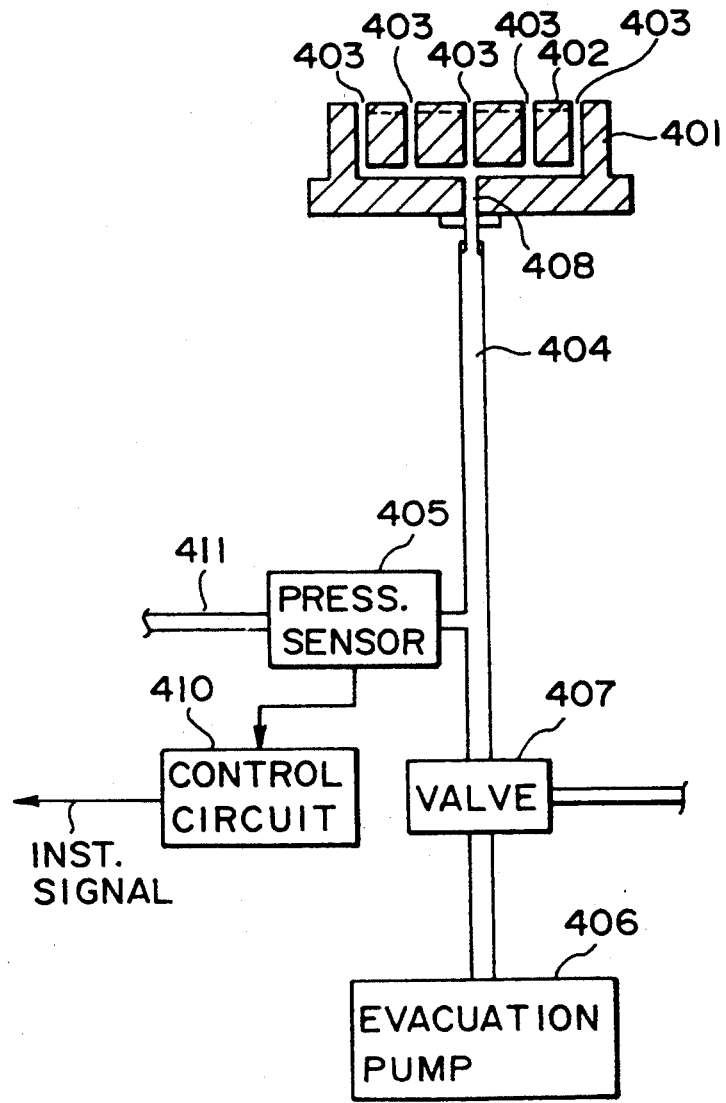

FIGS. 1A and 1B show an example of a vacuum attraction type wafer holding device without the present invention.

This wafer holding device includes a holding base 401 for holding a wafer (not shown) through vacuum attraction applied to the bottom face of the wafer; an evacuation pump 406 for applying vacuum attraction to the wafer; a piping member 404 for communicating the evacuation pump 406 with a suction passageway 408 (to be described later); and a valve 407 provided at a portion of the piping member 404 between the evacuation pump 406 and the holding base 401. It further includes a pressure sensor 405 provided at a portion of the piping member 404 between the valve 407 and the holding base 401, for detecting a differential pressure between the inside pressure of the piping member 404 and an ambience pressure (external pressure) as introduced from an introduction passageway 411. It further includes a control circuit 410 which is responsive to an output signal of the pressure sensor 405 to produce an instruction signal, for starting a subsequent step (e.g. a signal designating start of movement of the wafer holding device to a wafer exposure station) when the differential pressure represented by the pressure sensor output signal increases beyond a predetermined level.

The holding base has an attracting surface 402, two concentric ring-like grooves $409_1$ and $409_2$ formed in the attracting surface, suction ports 403 and a suction passage 408 for communicating the suction ports 403 with the piping member 404. The attracting surface has been finished to attain a desired flatness of a wafer as it is attracted to this surface through vacuum attraction. One of the suction ports 403 is formed at a center of the attracting surface 402, four of them are formed in one of the grooves $409_1$ and $409_2$, and the remaining four suction ports are formed in the other groove. The valve 407 when closed is effective to communicate the inside of the piping member 404 with the external space and, when opened, is effective to communicate the inside of the piping member with the evacuation pump 406.

In this wafer holding device, a wafer to be held by vacuum attraction is conveyed by means of a known type conveying hand (not shown) to a position whereat it contacts the attracting surface 402 of the holding base 401. After this, the valve 407 is opened and the gas contained in a space (closed space) defined by the conveyed wafer, the attracting surface 402 and the two concentric grooves $409_1$ and $409_2$ formed in the attracting surface 402, is discharged by means of the evacuation pump 406 through the suction ports 403, the suction passageway 408 and the piping member 404. By this, the bottom face of the wafer is vacuum-attracted. Here, the pressure sensor 405 detects the differential pressure between the inside pressure of the piping member 404 and the external pressure, and produces and applies a signal, representing this differential pressure, to the control circuit 410. As it is discriminated by this control circuit 410 that the differential pressure represented by the pressure sensor 405 signal becomes greater than a predetermined level, the control circuit 410 produces an instruction signal such as described hereinbefore.

For releasing the vacuum attraction of the wafer, on the other hand, the valve 407 is closed and an external gas is supplied into the piping member 404.

In this wafer holding device, the pressure sensor 405 is disposed at a portion of the piping member 404 which is between the valve and the holding base 401 and thus, to be exact, the pressure sensor 405 senses the pressure in that portion of the piping member 404. Since the structure of the piping member 404 and the suction passageway 408 is complicated, there is a possibility that the sensed pressure is different from the pressure at the wafer attracting surface.

Figure 2A:
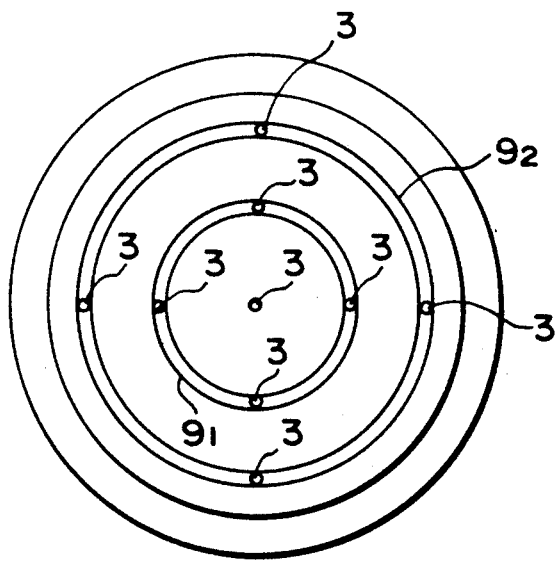
FIGS. 2A and 2B are a top plan view and a sectional view, respectively, of a wafer holding device according to an embodiment of the present invention.
Figure 2B:
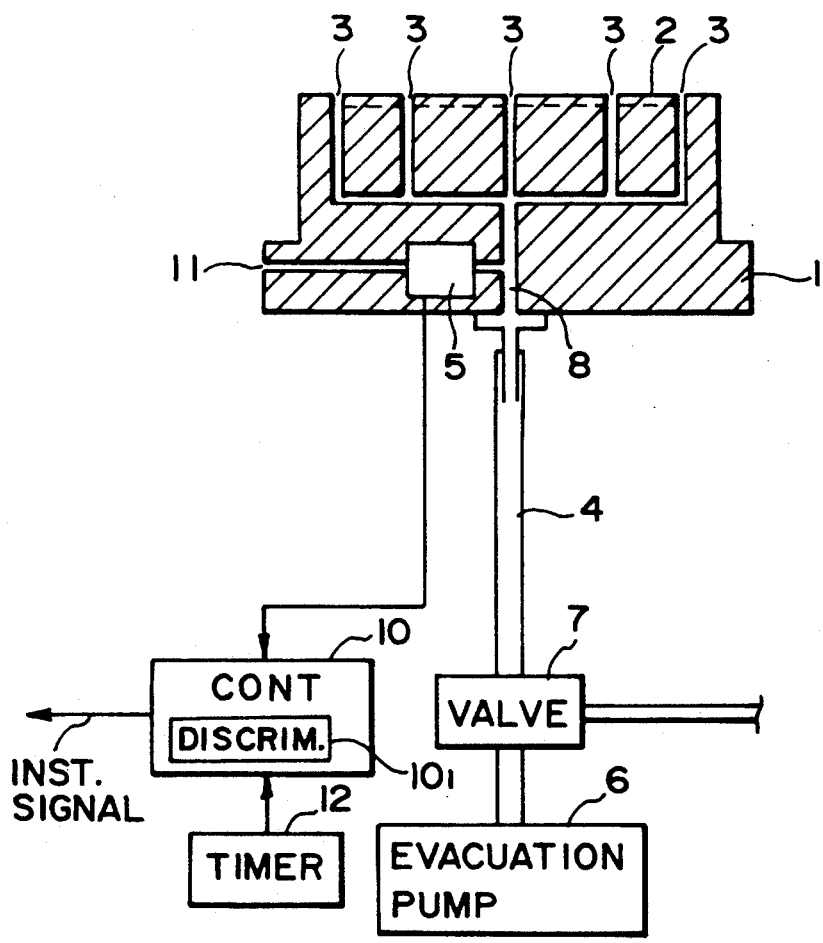

FIGS. 2A and 2B show a substrate holding device of vacuum attraction type according to an embodiment of the present invention. In this embodiment, the invention is applied to a wafer holding device for holding a semiconductor wafer through vacuum attraction onto which wafer a pattern for preparation of semiconductor devices is to be lithographically transferred. This wafer holding device may be incorporated into a deep UV or X-ray exposure apparatus. However, the applicability of the present invention is not limited to this example.

The wafer holding device of this embodiment includes a holding base 1 for holding a wafer (not shown) through vacuum attraction applied to the bottom face of the wafer; an evacuation pump 6 for applying vacuum attraction to the wafer; a piping member 4 for communicating the evacuation pump 6 with a suction passageway 8 (to be described later); and a valve 7 provided at a portion of the piping member 4 between the evacuation pump 6 and the holding base 1. The holding base has an attracting surface 2, two concentric ring-line grooves $9_1$ and $9_2$ formed in the attracting surface, suction ports 3 and a suction passage 8 for communicating the suction ports 3 with the piping member 4. The attracting surface has been finished to attain a desired flatness of a wafer as it is attracted to this surface through vacuum attraction. One of the suction ports 3 is formed at a center of the attracting surface 2, four of them are formed in one of the grooves $9_1$ and $9_2$, and the remaining four suction ports are formed in the other groove. The structure described above is the same as that shown in FIGS. 1A and 1B.

Differences from the FIGS. 1A and 1B example reside in that: Pressure sensor 5 is provided inside the holding base 1 and it detects a differential pressure between the inside pressure of the suction passageway 8 and an ambience pressure (external pressure) introduced through an introduction passageway 11 which communicates the pressure sensor 5 with the external space. Timer 12 is provided to measure the evacuation time. Control circuit 10 includes discriminating means $10_1$ for discriminating whether the evacuation time, as indicated by the timer 12 when the inside pressure of the suction passageway 8 represented by an output signal of the pressure sensor 5 becomes lower than a predetermined level, is longer or not longer than a predetermined time period.

As in the example of FIGS. 1A and 1B, the valve 7 when closed is effective to communicate the inside of the piping member 4 with the external space and, when opened, is effective to communicate the inside of the piping member with the evacuation pump 6.

Figure 3:
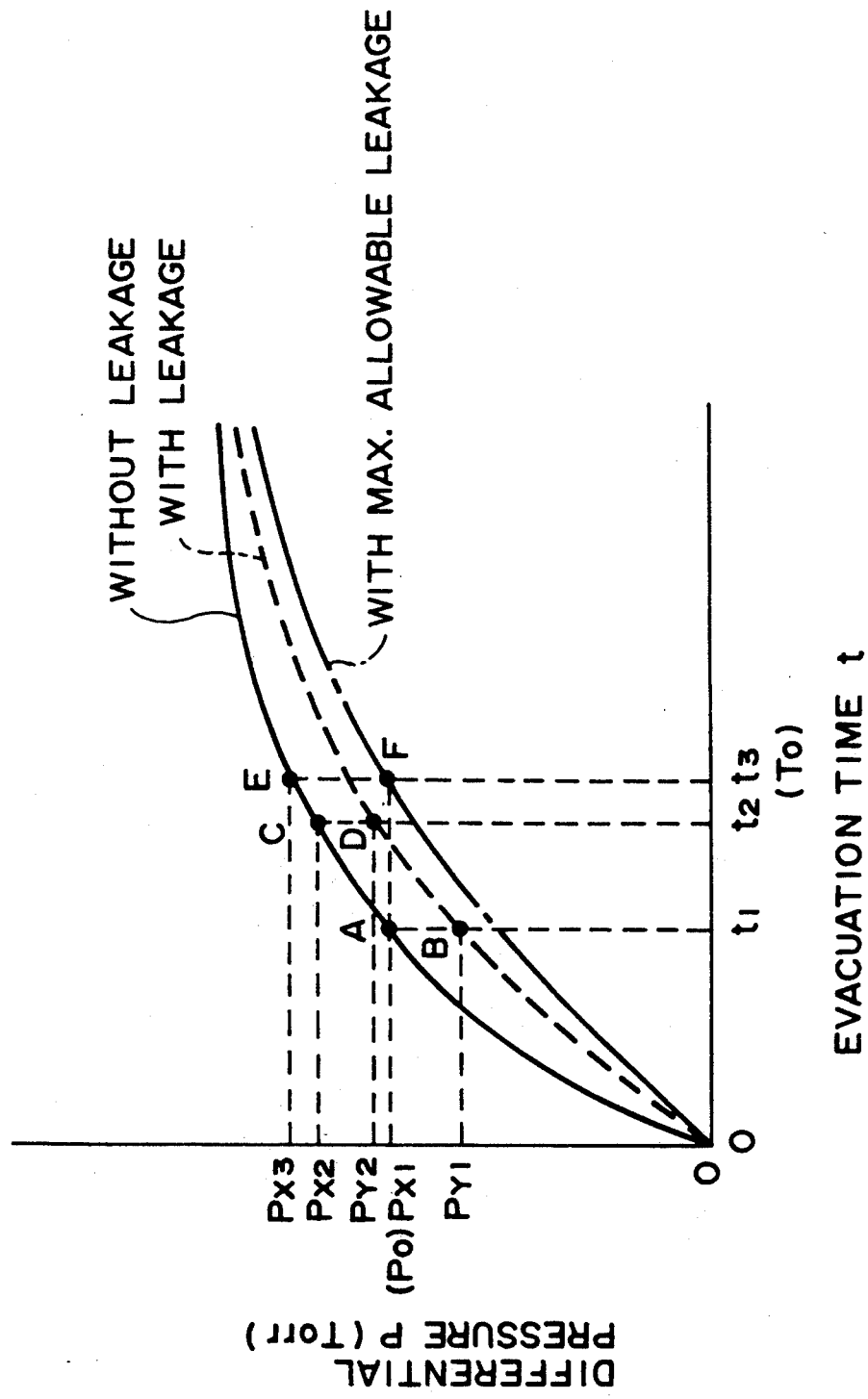
FIG. 3 is a graph showing the relationship between the evacuation time and the differential pressure.

Referring to FIGS. 3 and 4, the operation of the wafer holding device of this embodiment will be explained.

A wafer to be held by vacuum attraction is conveyed by means of a known type conveying hand (not shown) to a position whereat it contacts the attracting surface 2 of the holding base 1. After this, the valve 7 is opened and the gas contained in a space (closed space) defined by the conveyed wafer, the attracting surface 2 and the two concentric grooves $9_1$ and $9_2$ formed in the attracting surface 2, is discharged by means of the evacuation pump 6 through the suction ports 3, the suction passageway 8 and the piping member 4. By this, the bottom face of the wafer is vacuum-attracted. Here, the pressure sensor 5 detects the differential pressure P between the inside pressure of the suction passageway 8 and the external pressure, and produces and applies a signal, representing this differential pressure P, to the control circuit 10.

Here, the relationship between the evacuation time t from a start of vacuum attraction and the differential pressure P represented by the output signal of the pressure sensor 5, on an occasion when there is no leakage of external gas into the closed space, is such as depicted by a solid line in FIG. 3.

More specifically, before a start of vacuum attraction of the wafer (evacuation time t=0), since the valve 7 is once closed and the inside of the piping member 4 is communicated with the external space, the inside pressure of the suction passageway 8 becomes equal to the external pressure. Thus, the differential pressure P=0 (Torr). After this, as the vacuum attraction of the wafer starts, the inside pressure of the suction passageway decreases with the progress of evacuation. As a result, the differential pressure P increases and, at an evacuation time $t=t_1$ (point A), the differential pressure $P=P_{X1}$; at an evacuation time $t=t_2$ (point C), the differential pressure $P=P_{X2}$; and at an evacuation time $t=t_3$ (point E), the differential pressure $P=P_{X3}$.

Here, if the difference between the pressures at the top face and the bottom face of the wafer, necessary for attaining the wafer holding through vacuum attraction (such a difference will be referred to as "specific differential pressure"), is equal to the differential pressure $P_{X1}$ at point A in FIG. 3, since the differential pressure between the inside pressure of the suction passageway 8 and the external pressure as detected by the pressure sensor 5 corresponds to the difference between the pressures at the top face and the bottom face of the vacuum-attracted wafer with good precision, the control circuit 10 may produce an instruction signal for starting a succeeding step (e.g. a signal designating a start of movement of the holding device to a wafer exposure station) when it is discriminated that the differential pressure P represented by the output signal of the pressure sensor 5 has become higher than said specific differential pressure $P_0(=P_{X1})$, namely, that the inside pressure of the suction passageway 8 has become lower than the predetermined level. By this, it is possible to accomplish the vacuum attraction of the wafer with a smallest necessary attracting force and in a shortest necessary evacuation time.

The foregoing description has been made on an assumption that there is no external gas leakage into the closed space. Actually, however, due to distortion of the wafer or adhesion of foreign particles to the wafer, or from the positional relationship between the wafer and the attracting surface 2 as the wafer is placed on the latter, external gas leaking into the closed space occurs. The relationship between the evacuation time t from a start of vacuum attraction and the differential pressure P represented by the output signal of the pressure sensor 5 on this occasion, is such as depicted by a broken line in FIG. 3. It is seen that, at the same evacuation time t, the differential pressure P is smaller than that in a case when no external gas leaks into the closed space. Namely, at the evacuation time $t=t_1$ (point B), the differential pressure $P=P_{Y1}$ ($P_{Y1}<P_{X1}$) and, at the evacuation time $t=t_2$ (point D), the differential pressure $P=P_{Y2}$ ($P_{Y2}<P_{X2}$).

However, in the wafer holding device of the present embodiment, since the differential pressure P represented by the output signal of the pressure sensor 5 has a good correspondence with the difference between the pressures at the top face and the bottom face of the vacuum-attracted wafer, the control circuit 10 may produce an instruction signal such as described above when it is discriminated that the differential pressure P has become higher than said specific differential pressure $P_0$ ($=P_{X1}$) (namely, at the evacuation time $t=t_2$ in FIG. 3). By this, irrespective of external gas leakage into the closed space, it is possible to accomplish the vacuum attraction of the wafer with a smallest necessary attracting force and in a shortest necessary evacuation time.

Further, the relationship between the evacuation time t and the differential pressure $P_1$ as there occurs a maximum allowable leakage of external gas into the closed space, may be detected beforehand and, on this occasion, such an evacuation time t at which the differential pressure P becomes equal to said specific differential pressure $P_0$ (=$P_{X1}$), namely, the evacuation time t=$t_3$ (point F) in the case of the broken line in FIG. 3, may be detected beforehand. If on this occasion the differential pressure P represented by the output of the pressure sensor 5 does not become greater than said specific differential pressure $P_0$ (=$P_{X1}$) even after the evacuation time t from a start of the vacuum attraction of the wafer as measured through the timer 12 becomes longer than a predetermined evacuation time $T_0$ (=$t_2$), the control circuit 10 may produce an instruction signal designating interruption of the wafer vacuum attraction or a signal indicating an abnormal state.

Thus, when the control circuit 10 and the discriminating means $10_1$ operate in accordance with the flow chart of FIG. 4, the yield as well as the throughput of the exposure apparatus can be enhanced.

More specifically, as the wafer vacuum attraction starts, the control circuit 10 reads an output signal of the pressure sensor 5 and an output signal of the timer 12 (step 71). The discrimination means $10_1$ discriminates whether the evacuation time t represented by the output of the timer 12 is longer or not longer than the predetermined evacuation time $T_0$ (step 72). If the former is longer than the latter, the control circuit 10 produces a signal which, as an example, indicates an abnormal state (step 73). If, on the other hand, the former is not longer than the latter, discrimination is made as to whether the differential pressure P represented by the output signal of the pressure sensor 5 is greater or not greater than said specific differential pressure $P_0$ (step 74). If the former is not greater than the latter, the sequence goes back to step 71. If the former is greater than the latter, the control circuit 10 produces an instruction signal such as described hereinbefore (step 75).

For releasing the vacuum attraction of the wafer, the valve 7 is closed and external gas is introduced into the piping member 4.

In the wafer holding device of the present embodiment, the pressure sensor may be provided in a bottom portion of the holding base 1, and gas in the suction passageway 8 may be introduced from a position adjacent to the bottom of the holding base 1. Thus, if it is desired to provide cooling water pipe means in the holding base 1 for cooling a wafer during exposure thereof, it is possible to secure the inside space for the pressure sensor 5.

Figure 5A:
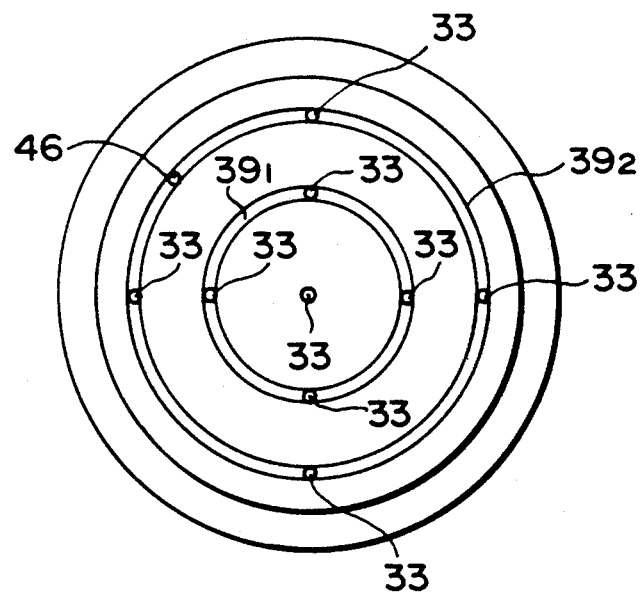
FIGS. 5A and 5B are a top plan view and a sectional view, respectively, of a wafer holding device according to another embodiment of the present invention.
Figure 5B:
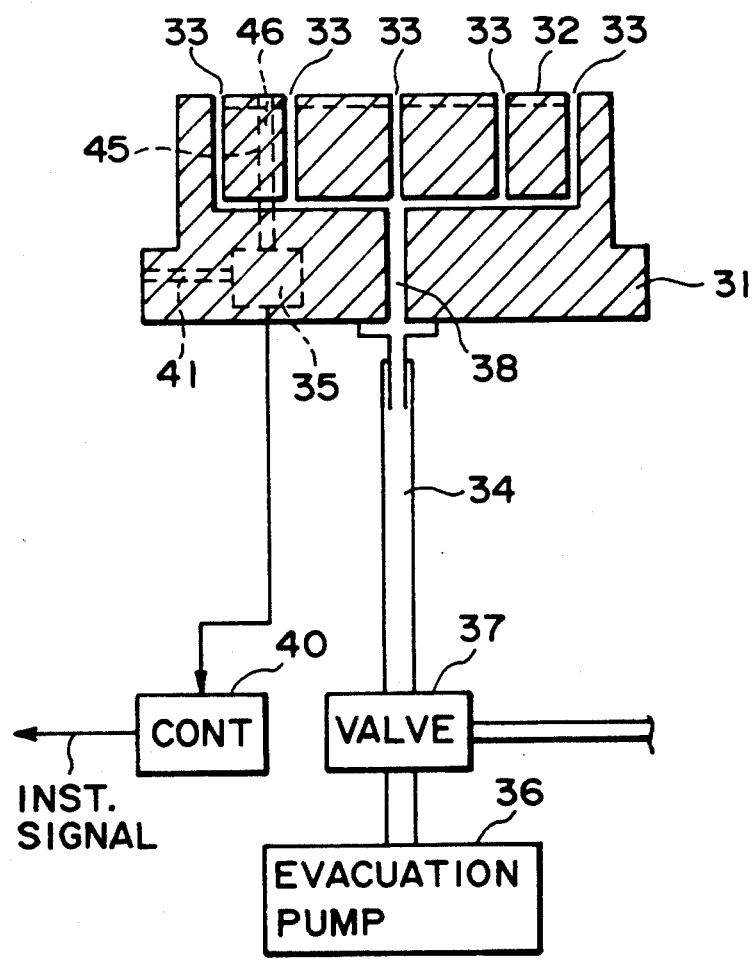

FIGS. 5A and 5B show a wafer holding device according to a second embodiment of the present invention which is usable in an X-ray exposure apparatus, for example.

The wafer holding device of this embodiment differs from the embodiment shown in FIGS. 2A and 2B in that: As shown in FIG. 5B, pressure sensor 35 provided in a holding base 31 serves to detect a differential pressure between (i) an inside pressure of a closed space introduced from an introduction port 46 (formed in an outer one ($39_2$) of two concentric ring-like grooves defined in an attracting surface 32 of the holding base, and at a position as illustrated in FIG. 5B) and through a second introduction passageway 45, and (ii) an ambience pressure (external pressure) introduced through a first introduction passageway 41. Timer means for measuring the evacuation time is not used. Further, a control circuit 40 is not equipped with a discriminating means such as at $10_1$ in FIG. 2B.

In the holding device of this embodiment, since the pressure sensor 35 detects the differential pressure by using the pressure in the closed space, it is possible to detect the pressure at the bottom face of the vacuum-attracted wafer with higher precision as compared with the FIG. 2 embodiment.

The control circuit 40 serves only to produce an instruction signal designating a start of a subsequent step, if it is discriminated that the pressure in the closed space represented by the output signal of the pressure sensor 35 has become lower than a predetermined pressure.

Also in the present embodiment, the pressure sensor 35 may be provided in a bottom portion of the holding base 31, and a gas in the closed space may be introduced to the sensor through the second introduction passageway 45. Thus, if it is desired to provide cooling water pipe means in the holding base 31 for cooling a wafer during exposure thereof, it is possible to secure the inside space for the pressure sensor 35.

The device of this embodiment may be equipped with a timer for measuring the evacuation time, and the control circuit 40 may be provided with discriminating means such as at $10_1$ in FIG. 2B. On that occasion, the control circuit 40 may produce an instruction signal for starting a subsequent step (e.g. a signal designating a start of movement of the holding device to a wafer exposure station in the X-ray exposure apparatus), after it is discriminated that within a predetermined evacuation time the differential pressure represented by the output of the pressure sensor 35 has become greater than a specific differential pressure, namely, that the inside pressure of the closed space has become lower than a predetermined pressure.

In the foregoing description, the pressure sensor 5 shown in FIG. 2 and the pressure sensor 35 shown in FIG. 5 each detects a differential pressure between the inside pressure of the suction passageway 8 (or of the closed space) and the external pressure. However, it may be one adapted to directly detect the inside pressure of the suction passageway 8 (or of the closed space). Particularly when the external pressure is controlled at a constant level, there is no specific necessity of detecting the differential pressure. Since, on that occasion, it is not necessary to introduce the external gas to the pressure sensor 5 or 35, the provision of the introduction passageway 11 or the first introduction passageway 41 is not necessary.

When the inside pressure of the suction passageway 8 or of the closed space is to be directly detected, a pressure sensor comprising a load cell may be disposed at a desired position in the suction passageway or in the closed space.

The configuration of the attracting surface of the holding base is not limited to the disclosed form, and a pin-chuck type wherein a plurality of columnar projections are provided on a surface of the holding base, to be opposed to the bottom face of a wafer, may be used.

Figure 6:
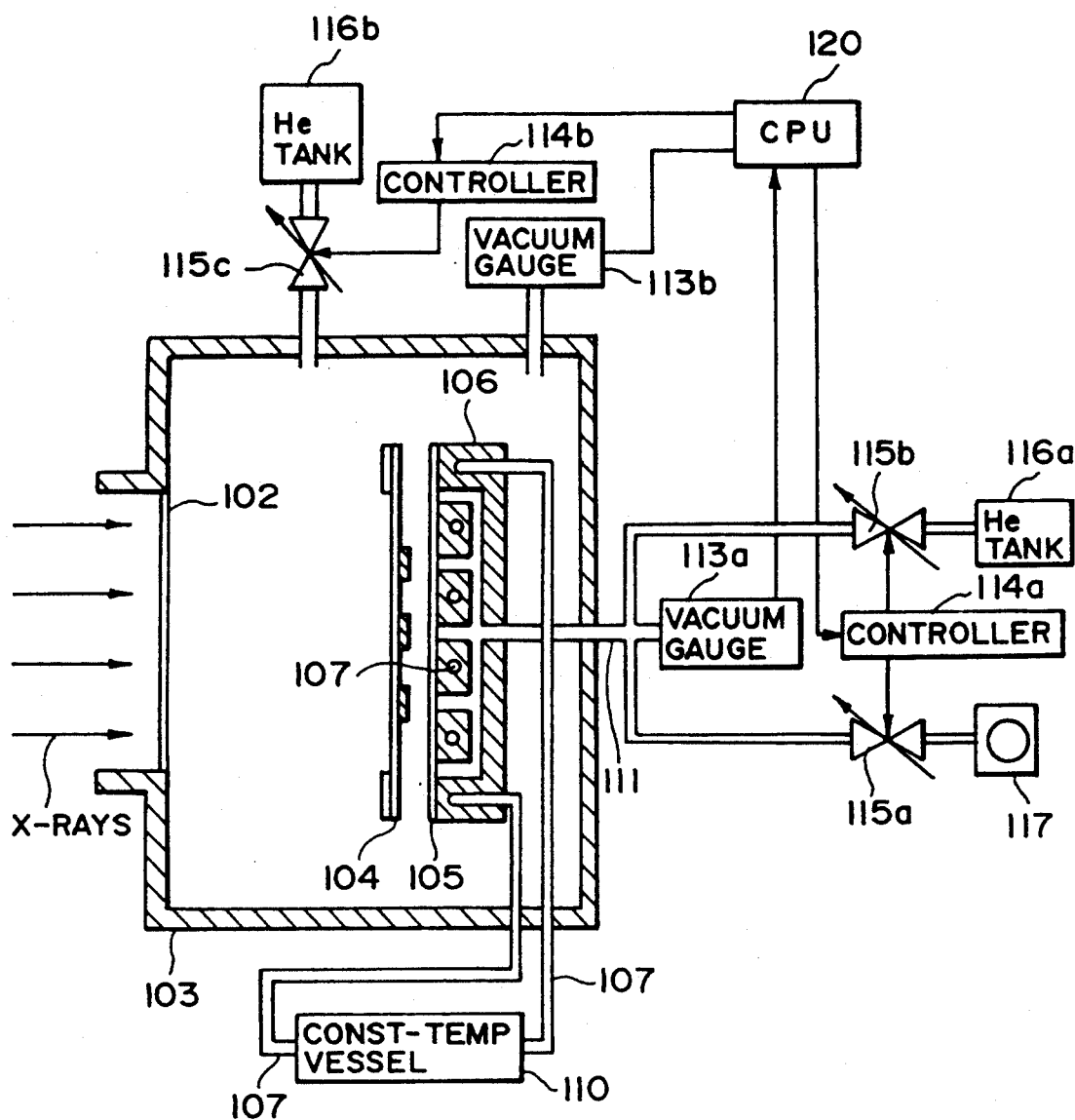
FIG. 6 is a sectional view of an exposure apparatus having a wafer holding device, without the present invention.

FIG. 6 shows an example of an X-ray exposure apparatus having such a substrate holding device but without the present invention. This exposure apparatus is of a proximity type in which a mask 104 and a wafer 105 are disposed with an interval of a few tens of microns and in this state a pattern of the mask is transferred onto the wafer.

The X-ray exposure apparatus of this example includes a chamber 103 filled with a helium (He) gas which is transmissive to X-rays produced by an accumulation ring or the like; a beryllium window (hereinafter "Be window") 102 provided in a portion of the chamber 103 for transmission of the X-rays therethrough; a second vacuum gauge 113b for detecting the inside pressure of the chamber 103; a second He tank 116b for supplying the He gas into the chamber 103; a third gas adjusting valve 115c for adjusting the quantity of He gas supply from the He tank 116b into the chamber 103; a second controller 114b for controlling opening/closing motion of the third gas adjusting valve 115c; and a substrate holding device of the structure to be described below.

The substrate holding device of this X-ray exposure apparatus includes a wafer chuck (holding base) 106; a flow passageway 107 extending into the wafer chuck 106; a constant-temperature vessel 110 for circulating temperature controlled water through the flow passageway 107; an evacuation passageway 111 for communicating a chucking surface $106_1$ (FIG. 7) of the wafer chuck 106 with a pump (vacuum source) 117 and for communicating the chucking surface $106_1$ with a first He tank (He gas supply source) 116a; a first gas adjusting valve 115a provided in a portion of the evacuation passageway 111 between the wafer chuck 106 and the pump 117; a second gas adjusting valve 115b provided in a portion of the evacuation passageway 111 between the wafer chuck 106 and the first He tank 116a; a first vacuum gauge 113a provided in a portion of the evacuation passageway 111 between the wafer chuck 106 and the first or second gas adjusting valve 115a or 115b, for detecting the inside pressure of a small space (clearance) as defined between the bottom face of the wafer 105 and the chucking surface $106_1$; and a control means comprising microprocessor (CPU) 120 and a first controller 114a, responsive to an output signal from the first vacuum gauge 113a to control the first and second gas adjusting valves 115a and 115b. Here, the CPU 120 cooperates also with the first controller 114b to control the third gas adjusting valve 115c on the basis of an output signal from the second vacuum gauge 113b. The mask 104 for lithographic transfer of a mask pattern, is disposed in the chamber 103 with a certain gap (clearance) from a vacuum-attracted wafer 105.

Figure 7:
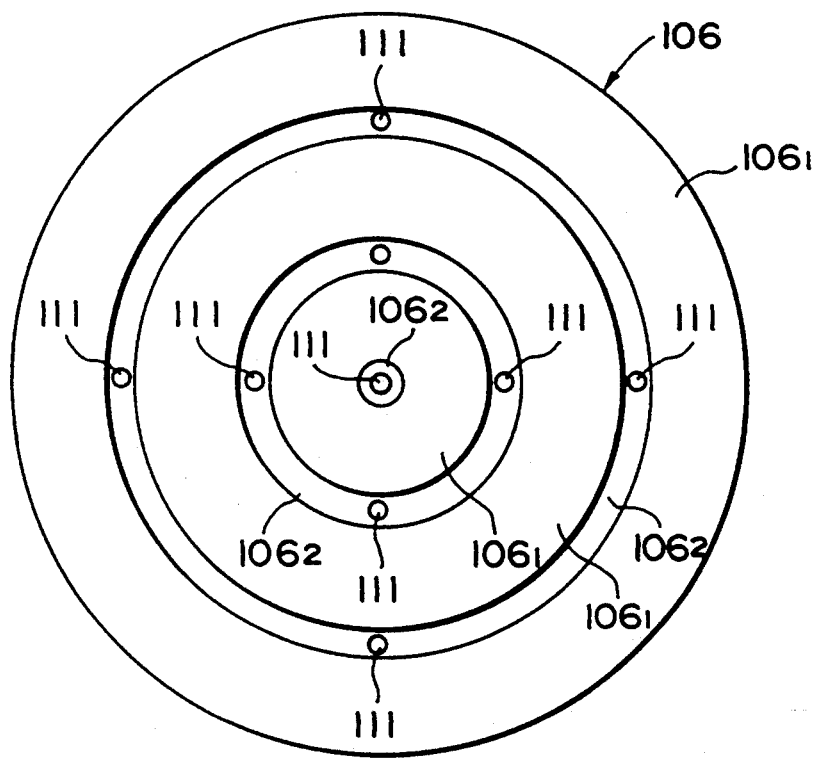
FIG. 7 is a top plan view of a wafer chucking surface of the device of FIG. 6.

As best seen in FIG. 7, two concentric ring-like grooves $106_2$ are formed in the chucking surface $106_1$ of the wafer chuck 106. Also, another groove (recess) $106_2$ is formed at a central portion of the chucking surface $106_1$. The evacuation passageway 111 is branched within the wafer chuck 106 and the ends thereof are open to the concentric grooves $106_2$ and the central recess $106_2$, as illustrated.

The operation of this X-ray exposure apparatus will now be explained.

Before a start of lithographic transfer of the mask pattern to a wafer 105, the CPU 120 reads the output signal of the second vacuum gauge 113b and controls the second controller 114b in accordance with the read output signal, to control the opening/closing of the third gas adjusting valve 115c to thereby maintain the inside pressure of the chamber at 200 Torr. Subsequently, as a wafer 105 to be vacuum attracted is conveyed by means of a conveying hand (not shown) to an unshown position, the CPU 120 controls the first controller 114a to open the first gas adjusting valve 115a. As the first gas adjusting valve 115a is opened, the evacuation passageway 111 is now communicated with the pump 117, whereby any He gas which is present in a small space defined between the bottom face of the wafer 105 and the chucking surface $106_1$ or the grooves $106_2$ of the wafer chuck 106 is drawn, and thus the inside pressure of the small space decreases. By the pressure difference between the top and bottom surfaces of the wafer 105 resulting therefrom, the wafer 105 is attracted to and held by the wafer chuck 106.

Figure 8:
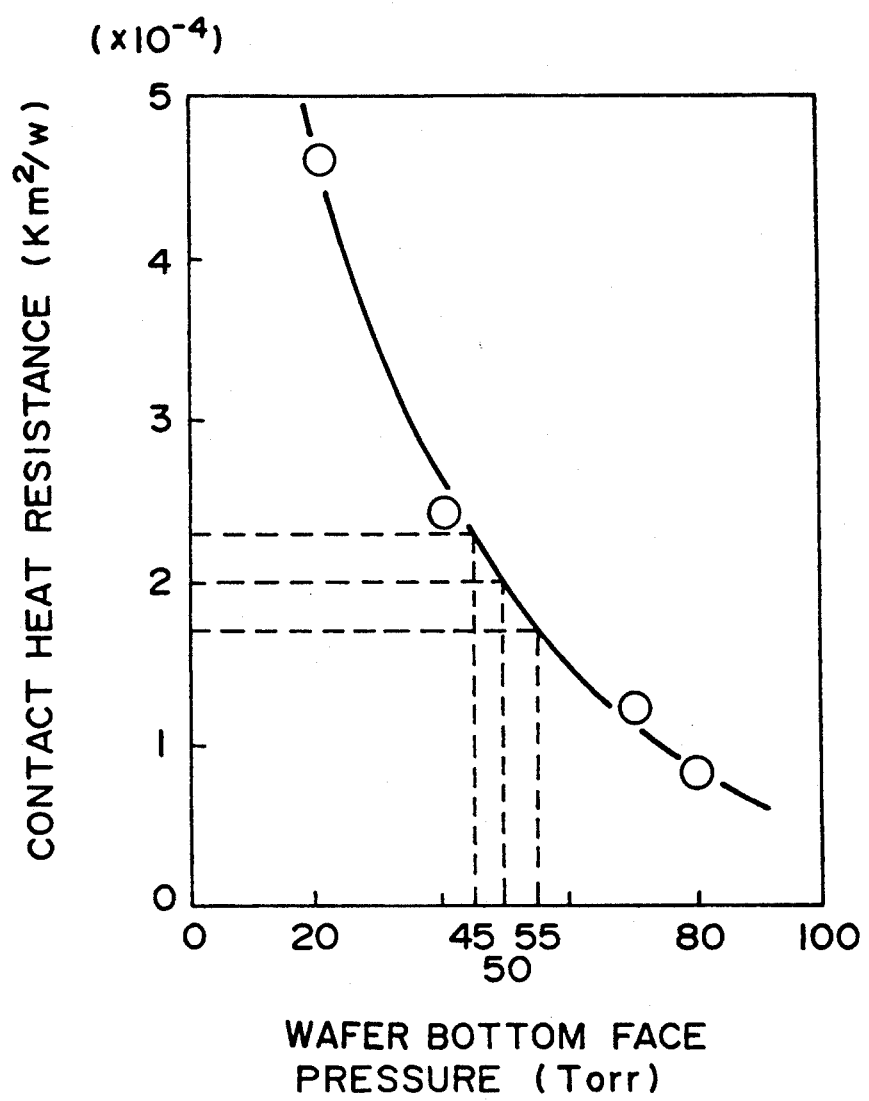
FIG. 8 is a graph showing the relationship between the bottom face pressure of a wafer and the contact heat resistance.

From the results of experiments having been made by using such an X-ray exposure apparatus, it has been found that, in order to retain the vacuum attracting force while maintaining the pattern transfer precision, the contact heat resistance between the wafer 105 and the wafer chuck 106 should be kept at $2 \times 10^{-4}$ K·m²/W or lower and, to this end, from the relationship between the contact heat resistance and the wafer bottom face pressure such as shown in FIG. 8, the wafer bottom pressure (i.e. the pressure in the small space) should be kept at about 50 Torr.

In response to a start of vacuum attraction of the wafer 105 in this X-ray exposure apparatus, the CPU 120 reads the output signal of the first vacuum gauge 113a at a predetermined timing, and monitors the inside pressure of the evacuation passageway 111 as represented by this output signal. Additionally, it controls the first controller 114a so as to maintain a constant pressure of 50 Torr in the evacuation passageway 111, and controls the opening/closing of the first and second gas adjusting valves 115a and 115b.

After a constant pressure is attained in the evacuation passageway 111, the X-rays are projected through the Be window 102 and the mask 104 to the wafer 105. By this, the mask pattern is transferred to the wafer. Here, the temperature control of the wafer being exposed is carried out by circulating the temperature controlled water from the constant-temperature vessel 110 through the flow passageway 107 to thereby maintain the temperature of the wafer chuck 106 constant.

However, in this type of substrate holding device, in order to suppress a temperature rise of the wafer 105 within a range of about ±0.06° C. so as to avoid deterioration of the pattern transfer precision, the change in contact heat resistance as the wafer is irradiated with the X-rays at an intensity of 150 mW/cm², for example, has to be maintained in a range of about $\pm 4.0 \times 10^{-5}$ K·m²/W. Here, the tolerance of pressure change in the aforementioned small space is about ±5Torr (FIG. 8). Since however the first vacuum gauge 113a for detecting the pressure of the small space is provided in a portion of the evacuation passageway 111 between the wafer chuck 106 and the first or seconds gas adjusting valve 115a or 115b, there is a possibility that, if the magnitude of warping of the wafer 105 or the roughness of the bottom face thereof changes and as a result the amount of He gas flowing from the inside ambience of the chamber 103 into the small space changes, due to the conductance between the first vacuum gauge 113a and the chucking surface $106_1$ of the wafer chuck 106 the read value of the first vacuum gauge 113a changes irrespective that the inside pressure of the small space is unchanged. This leads to an inconvenience of failure in reading the inside pressure of the small space with good precision.

An embodiment of the present invention which overcomes such a problem will now be explained.

FIG. 9 shows an X-ray exposure apparatus with a substrate holding device, according to an embodiment of the present invention.

The X-ray exposure apparatus of this embodiment includes a chamber 203 filled with a helium (He) gas which is transmissive to X-rays produced by an accumulation ring or the like; a beryllium window (hereinafter "Be window") 202 provided in a portion of the chamber 103 for transmission of the X-rays therethrough; a second vacuum gauge 213b for detecting the inside pressure of the chamber 203; a second He tank 216b for supplying the He gas into the chamber 203; a third gas adjusting valve 215c for adjusting the quantity of He gas supply from the He tank 216b into the chamber 203; and a second controller 214b for controlling opening/closing motion of the third gas adjusting valve 215c.

The substrate holding device of this X-ray exposure apparatus includes a wafer chuck (holding base) 206; a flow passageway 207 extending into the wafer chuck 206; a constant-temperature vessel 210 for circulating temperature controlled water through the flow passageway 207; an evacuation passageway 211 for communicating a chucking surface $206_1$ (FIG. 7) of the wafer chuck 206 with a pump (vacuum source) 217 and for communicating the chucking surface with a first He tank (He gas supply source) 216a; a first gas adjusting valve 215a provided in a portion of the evacuation passageway 211 between the wafer chuck 206 and the pump 217; a second gas adjusting valve 215b provided in a portion of the evacuation passageway 211 between the wafer chuck 206 and the first He tank 216a. The structure described above is basically the same as that of the FIG. 6 example.

However, in the X-ray exposure apparatus of this embodiment, a gauging passageway 230 extends to the chucking surface $206_1$ of the wafer chuck 201, and a first vacuum gauge 213a for detecting the inside pressure of a small space (clearance) as defined between the bottom face of a wafer 205 and the chucking surface $206_1$ of the wafer chuck 206, is attached to a free end of the gauging passageway 230. Further, a valve 231 is provided between the evacuation passageway 211 and the gauging passageway 230. Control means comprising a microprocessor (CPU) 220 and a first controller 214a for controlling the first and second gas adjusting valves 215a and 215b as well as the valve 231, operates in response to an output signal of the first vacuum gauge 213a. This is a difference from the FIG. 6 example.

Figure 10:
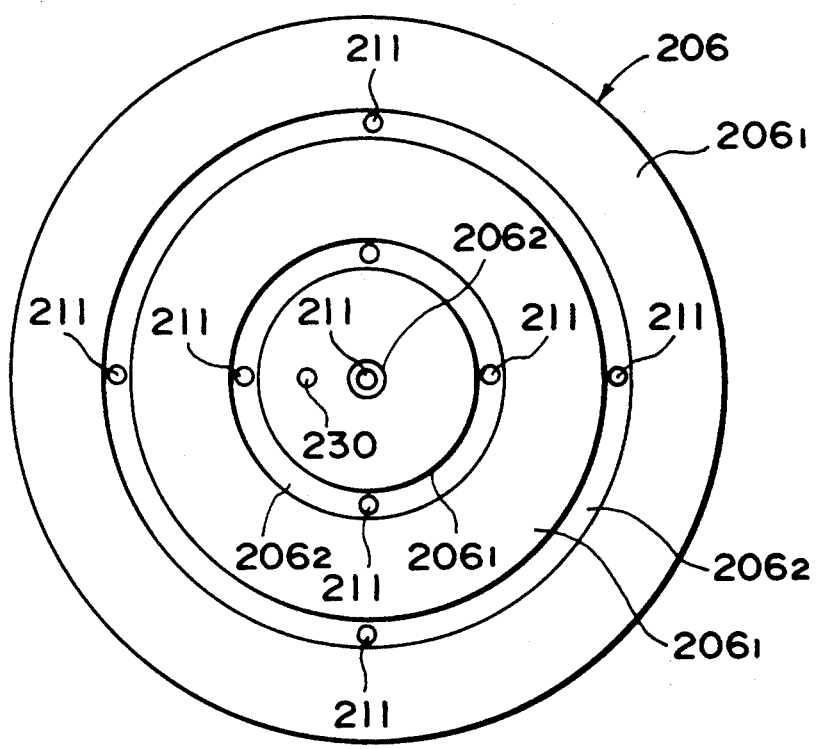
FIG. 10 is a top plan view of a wafer chucking surface of the device of FIG. 9.

Also, as shown in FIG. 10, the wafer chuck 206 has two concentric ring-like grooves $206_2$ formed in the chucking surface $206_1$ as well as another groove (recess) $206_2$ formed at a central portion of the chucking surface $206_1$. The evacuation passageway 211 is branched to be opened to the ring-like grooves $206_2$ and the central recess $206_2$. This is the same as the FIG. 7 example. However, as compared with the FIG. 7 example, in this embodiment, the gauging passageway 230 opens to a portion of the chucking surface $206_1$ which is between the central recess $206_2$ and the inner one of the two ring-like grooves $206_2$.

The CPU 220 cooperates also with the second controller 214b to control the third gas adjusting valve in response to an output signal of the second vacuum gauge 213b. Also, a mask 204 for the lithographic transfer of a mask pattern is placed in the chamber 203 with a certain gap (clearance) from a vacuum attracted wafer 205.

The operation of the X-ray exposure apparatus of this embodiment will now be explained.

Before a start of lithographic transfer of the mask pattern to a wafer 205, the CPU 220 reads the output signal of the second vacuum gauge 213b and controls the second controller 214b in accordance with the read output signal, to control the opening/closing of the third gas adjusting valve 215c to thereby maintain the inside pressure of the chamber 203 at 200 Torr. Subsequently, as a wafer 205 to be vacuum attracted is conveyed by means of a conveying hand (not shown) to an unshown position, the CPU 220 controls the first controller 214a to open the first gas adjusting valve 215a and the valve 231. As the first gas adjusting valve 215a and the valve 231 are opened, each of the evacuation passageway 211 and the gauging passageway 230 are now communicated with the pump 217, whereby any He gas which is present in a small space defined between the bottom face of the wafer 205 and the chucking surface $206_1$ or the grooves $206_2$ of the wafer chuck 206 as well as any He gas which is present in the gauging passageway 230 are drawn, and thus the inside pressure of the small space decreases. By the pressure difference between the top and bottom surfaces of the wafer 205 resulting therefrom, the wafer 205 is attracted to and held by the wafer chuck 206.

As the vacuum attraction of the wafer 205 starts, almost all the He gas in the gauging passageway 230 to which the first vacuum gauge 213a is attached is discharged with progress of evacuation to some degree, and then there is no flow of He gas in the gauging passageway 230. Thus, the CPU 220 controls the first controller 214a so as to close the valve 231. After this, in order to retain a contact heat resistance between the wafer 205 and the wafer chuck 206 at $2 \times 10^{-4}$ K·m²/W or lower, the CPU 220 reads an output of the first vacuum gauge 213a at a predetermined timing and monitors the inside pressure of the gauging passageway 230 represented by this output signal. Also, it controls the first controller 214a to control the opening/closing of the first and second gas adjusting valves 215a and 215b so as to maintain a constant pressure of 50 Torr in the gauging passageway 230. Here, since the level of pressure as indicated by the first vacuum gauge 213a corresponds to the inside pressure of the aforementioned small space with good precision, it is possible to maintain the inside pressure of the small space constantly at 50 Torr, with good precision.

After a constant pressure is attained in the small space, the X-rays are projected through the Be window 202 and the mask 204 to the wafer 205. By this, the mask pattern is transferred to the wafer. Here, the temperature control of the wafer 205 being exposed is carried out by circulating the temperature controlled water from the constant-temperature vessel 210 through the flow passageway 207 to thereby maintain the temperature of the wafer chuck 206 constant.

With the operation described above, in the X-ray exposure apparatus of this embodiment, the pressure in the closed space can be maintained at 50 Torr with good precision. This ensures a small contact heat resistance between a wafer 205 and the wafer chuck 206 at a level of about $2 \times 10^{-4}$ K·m²/W which is lower than a threshold of causing degradation of the pattern transfer precision.

The operation and advantages of the valve 231 of this embodiment will now be explained.

The valve 231 is not always necessary. If however the valve 231 is omitted, it takes a longer time to attain an inside pressure of 50 Torr in the aforementioned small space for the reasons to be described below, and the productivity decreases as compared with a case when the valve 231 is provided.

The evacuation of the He gas contained in the gauging passageway 230, communicating the first vacuum gauge 213a with the chucking surface $206_1$ of the wafer chuck 206, is executed by means of the evacuation passageway 211 (opened to the central recess $206_2$ and the inner ring-like groove $206_2$ (FIG. 10) of the wafer chuck 206) and through the small space defined between the wafer 205 and the central portion of the chucking surface $206_1$ of the wafer chuck 206. This small space is very narrow, and therefore its flow resistance is large. As a result, the evacuation of He gas requires a long time. This leads to a situation that, unless a certain time period elapses, due to the flow of gas (He gas) produced in the gauging passageway 230, the pressure as indicated by the first vacuum gauge 213a does not correspond to the pressure in the small space.

In consideration of this, upon a start of vacuum evacuation, first the He gas contained in the gauging passageway 230 is caused to flow through the valve 231 into the evacuation passageway 211 and, by doing so, it is possible to shorten the He gas evacuation time. After this, the CPU 220 checks whether the inside pressure of the evacuation passageway 211 indicated by first vacuum gauge 213a has become not greater than a predetermined level and, if so, it controls the first controller 214a to close the valve 231. Then, the CPU 220 reads the output of the first vacuum gauge 213a at a predetermined timing until the inside pressure of the evacuation passageway 211 becomes equal to 50 Torr.

Next, various forms of the chucking surface of the wafer chuck will be explained.

FIG. 11 shows another form of a chucking surface of a wafer chuck.

In the wafer chuck 226 of this embodiment, one concentric ring-like groove $226_2$ is formed at an outer peripheral portion of the chucking surface $226_1$. Branched ends of an evacuation passageway 211 are opened to upper and lower portions and right-hand and left-hand portions (as viewed in the drawing) of the groove $226_2$ (upper and lower branched ends of the evacuation passageway 211 are not shown). Gauging passageway 230 is opened to a central portion of the chucking surface $226_1$. This portion of the structure described above is different from the wafer chuck 206 of FIG. 10.

The wafer chuck 226 of this example is effective to attain a larger contact area between a wafer 205 and the chucking surface $226_1$ and, for this reason, it is possible to reduce the heat contact resistance as compared with the wafer chuck 206 of the FIG. 10 embodiment.

FIG. 12 shows another form of a chucking surface of a wafer chuck.

Like the wafer chuck 226 shown in FIG. 11, in the wafer chuck 236 of this embodiment, one concentric ring-like groove $236_2$ is formed at an outer peripheral portion of the chucking surface $236_1$. Branched ends of an evacuation passageway 211 are opened to upper and lower portions and right-hand and left-hand portions (as viewed in the drawing) of the groove $236_2$ (upper and lower branched ends of the evacuation passageway 211 are not shown). Gauging passageway 230 is opened to a central portion of the chucking surface. Additionally, three narrow grooves $236_3$ are formed equiangularly so as to communicate the open end of the gauging passageway 230 with the concentric groove $236_2$.

This wafer chuck 236 has an advantage that, even if the valve 231 shown in FIG. 9 is omitted, the three narrow grooves $236_3$ can serve as evacuation passageways and, for this reason, an enhanced efficiency of evacuation of He gas in the gauging passageway 230 is attainable.

In the embodiments of wafer chuck (206, 226, 236) shown in FIGS. 10-12, the evacuation passageway 211 is opened to the groove at four sites. However, provided that the openings have good symmetry, the number is not limited to "four".

While in the foregoing the invention has been described with reference to examples of X-ray exposure apparatus, the invention is applicable to any type of exposure apparatus such as one using light, for example, wherein it has a substrate holding device by which a substrate is held through a pressure difference between the top and bottom faces thereof while the substrate is maintained at a constant temperature.

Further, the article to be held by a substrate holding device of the present invention is not limited to a wafer. It may be a substrate for a liquid crystal display on which thin film transistors and the like are to be formed.

While the invention has been described with reference to the structures disclosed herein, it is not confined to the details set forth and this application is intended to cover such modifications or changes as may come within the purposes of the improvements or the scope of the following claims.

What is claimed is:

1. A vacuum-attraction holding device, comprising:
   a holding base having an attracting surface, for holding a substrate thereon;
   a suction passageway formed in said base, for supplying a vacuum to said holding base to attract the substrate to said attracting surface; and
   a pressure sensor provided in said base and being communicated with said suction passageway.

2. A device according to claim 1, further comprising an introduction passageway extending into said base, for introducing an ambience gas of said base, wherein said pressure sensor detects a difference between the pressure in said suction passageway and the pressure of the ambience gas.

3. A device according to claim 1, further comprising a timer for measuring a time in which vacuum is applied to said suction passageway, wherein, on the basis of the measured time and a differential pressure outputted by said pressure sensor, any abnormal operation is discriminated.

4. A vacuum-attraction holding device, comprising:
   a holding base having an attracting surface, for holding a substrate thereon;
   a suction passageway formed in said base, for supplying a vacuum to said holding base to attract the substrate to said attracting surface;
   a gauging passageway formed in said base separately from said suction passageway, said gauging passageway being opened to said attracting surface; and
   a pressure sensor communicated with said gauging passageway.

5. A device according to claim 4, wherein said pressure sensor detects a difference between the pressure in said gauging passageway and the pressure of an ambience gas of said base.

6. A device according to claim 4, further comprising a timer for measuring a time in which vacuum is applied to said suction passageway, wherein, on the basis of the measured time and a differential pressure outputted by said pressure sensor, any abnormal operation is discriminated.

7. An exposure apparatus, comprising:
a holding base having an attracting surface, for holding a substrate thereon;
a suction passageway formed in said base, for supplying a vacuum to said holding base to attract the substrate to said attracting surface;
a gauging passageway formed in said base separately from said suction passageway, said gauging passageway being opened to said attracting surface;
a pressure sensor communicated with said gauging passageway;
exposure means for exposing the substrate held on said base; and
control means for controlling at least one of the holding operation to the substrate through said base and the exposure operation to the substrate through said exposure means, on the basis of an output of said pressure sensor.

8. An apparatus according to claim 7, wherein said control means controls said at least one of the holding operation and the exposure operation, so that a a pressure of a predetermined level is attained between the substrate and said attracting surface.

9. An apparatus according to claim 7, further comprising a communication passageway for communicating said suction passageway and said gauging passageway, and a valve for openably closing said communication passageway.

10. An apparatus according to claim 9, wherein said valve is once opened upon a start of application of a vacuum to said suction passageway and then is closed.

11. An apparatus according to claim 7, wherein said pressure sensor detects a differential pressure with respect to a pressure surrounding said base.

12. An apparatus according to claim 7, wherein said pressure sensor detects a suction pressure produced between the substrate and said attracting surface.

13. A semiconductor wafer processing method for manufacture of semiconductor devices, said method comprising the steps of:
placing a semiconductor wafer on a holding base having an attracting surface;
supplying a vacuum to the base so that the wafer is attracted to the attracting surface through vacuum attraction;
detecting, within the base, a pressure related to the vacuum attraction; and
exposing the wafer held by said base;
wherein at least one of the holding operation to the wafer through the base and the exposure operation to the wafer is controlled on the basis of the detection of the pressure.

14. A method according to claim 13, wherein said pressure related to the vacuum attraction is controlled on the basis of the detection thereof so that said pressure has a predetermined level.

15. A method according to claim 13, wherein, in response to attainment of said pressure at said predetermined level, a subsequent operation for exposure of the wafer is started.

16. A semiconductor wafer processing method for manufacture of semiconductor devices, said method comprising the steps of:
providing a wafer holding base with a wafer attracting surface and having a suction passageway and a gauging passageway formed therein, wherein the gauging passageway is separate from the suction passageway and is opened to the attracting surface;
placing a semiconductor wafer on the base;
supplying a vacuum to the base through the suction passageway so that the wafer is attracted to the attracting surface through vacuum attraction;
detecting, through the gauging passageway, a pressure related to the vacuum attraction; and
exposing the wafer held by said base;
wherein at least one of the holding operation to the wafer through the base and the exposure operation to the wafer is controlled on the basis of the detection of the pressure.

* * * * *